United States Patent [19]

Kohyama

[11] 4,280,067
[45] * Jul. 21, 1981

[54] SEMICONDUCTOR CHARGE TRANSFER DEVICE HAVING A DECOUPLING GATE FOR STOPPING REVERSE CHARGE FLOW

[75] Inventor: Susumu Kohyama, Kawasaki, Japan

[73] Assignee: Tokyo Shibaura Denki Electric Co., Ltd., Kawasaki, Japan

[*] Notice: The portion of the term of this patent subsequent to Jul. 8, 1997, has been disclaimed.

[21] Appl. No.: 39,123

[22] Filed: May 15, 1979

Related U.S. Application Data

[63] Continuation of Ser. No. 821,212, Aug. 2, 1977, abandoned.

[30] Foreign Application Priority Data

Aug. 2, 1976 [JP] Japan .................. 51-92206

[51] Int. Cl.³ .................. G11C 19/28; H01L 29/78
[52] U.S. Cl. .................. 307/221 D; 357/24; 307/DIG. 3
[58] Field of Search ........ 357/24; 307/221 D, DIG. 3

[56] References Cited

U.S. PATENT DOCUMENTS

| | | | |
|---|---|---|---|
| 3,925,805 | 12/1975 | Erb .................. | 357/24 |
| 3,961,352 | 1/1976 | Colton et al. .................. | 357/24 |
| 3,979,603 | 9/1976 | Gosney .................. | 357/24 |
| 3,980,902 | 9/1976 | Tehon .................. | 357/24 |
| 4,007,381 | 2/1977 | Mohsen .................. | 357/24 |
| 4,007,446 | 2/1977 | Elmer et al. .................. | 357/24 |
| 4,021,682 | 3/1977 | Elmer et al. .................. | 307/221 D |
| 4,024,514 | 5/1977 | Elmer et al. .................. | 357/24 |
| 4,032,948 | 6/1977 | Engeler et al. .................. | 357/24 |
| 4,211,937 | 7/1980 | Kohyama .................. | 307/221 D |

FOREIGN PATENT DOCUMENTS

2403190 8/1974 Fed. Rep. of Germany ............. 357/24

OTHER PUBLICATIONS

Rosenbaum et al. "A 16384-Bit High-Density CCD Memory", IEEE J. Solid-State Circuits, vol. sc-11 (2/76) pp. 33-39.

Sequin et al., Charge Transfer Devices, Academic Press, N. Y. (7/75).

Primary Examiner—Gene M. Munson
Attorney, Agent, or Firm—Oblon, Fisher, Spivak, McClelland & Maier

[57] ABSTRACT

A semiconductor charge transfer device comprising: a semiconductor charge transfer element including a plurality of transfer electrodes on an insulating layer formed on a semiconductor substrate and a detection node formed on the semiconductor substrate; potential barrier means for signal charge packets transfer provided between the final stage cell of the semiconductor charge transfer element and the detection node; and a differential detecting circuit of flip-flop type having a drive transistor directly -coupled with the detection node, wherein the potential barrier means provides a potential barrier against the low level of the detection node when the drive transistor is conductive.

2 Claims, 23 Drawing Figures

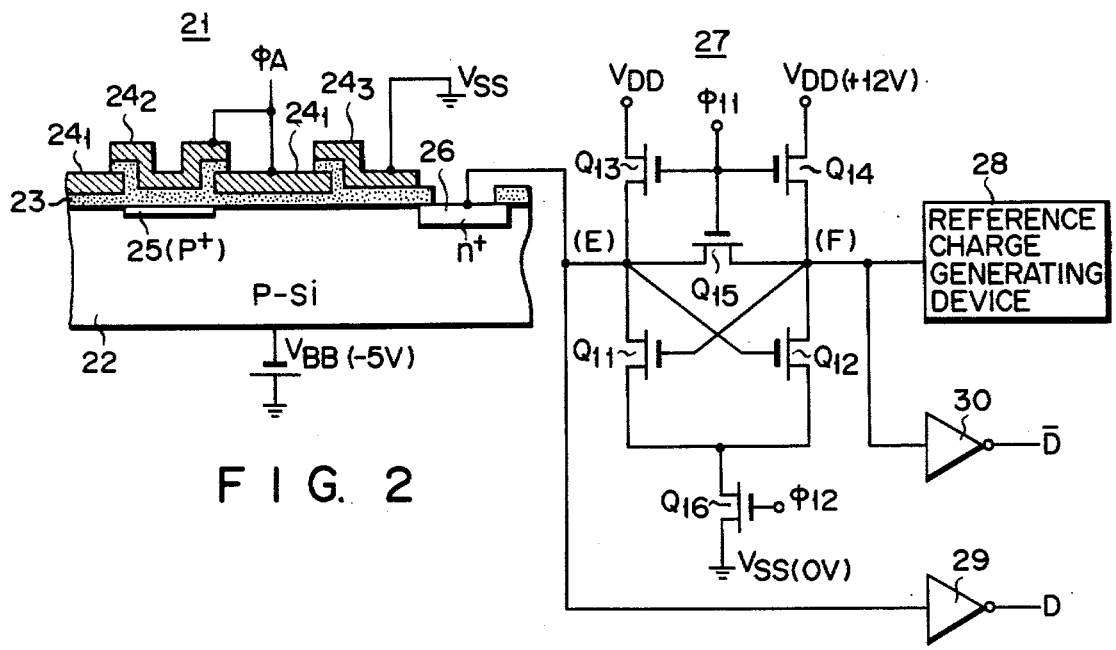
F I G. 2
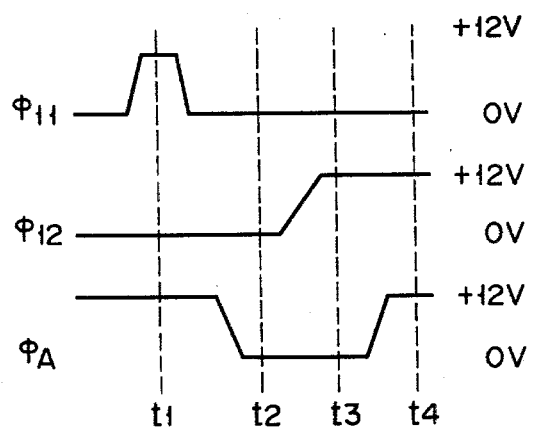
F I G. 3

F I G. 4A
t = t1
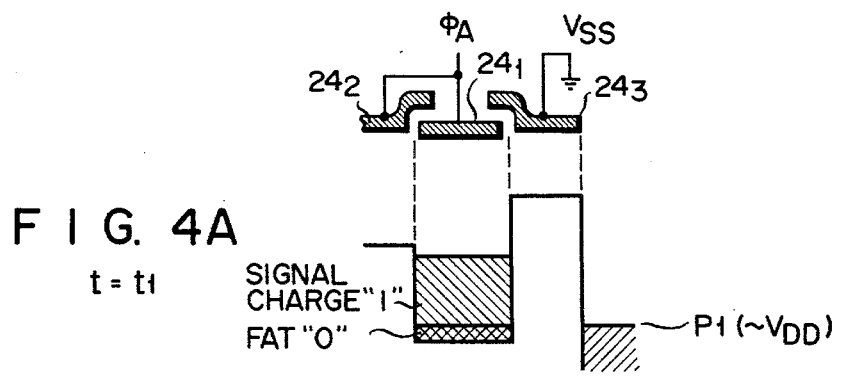
F I G. 4B
t = t2
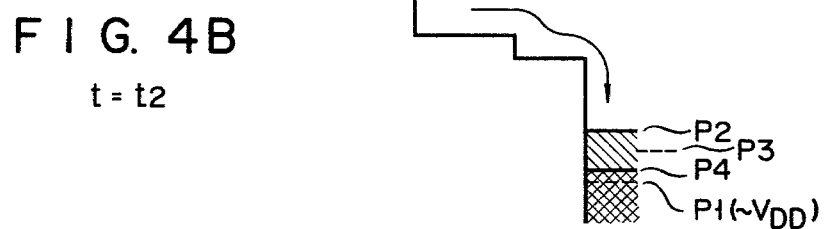
F I G. 4C
t = t3
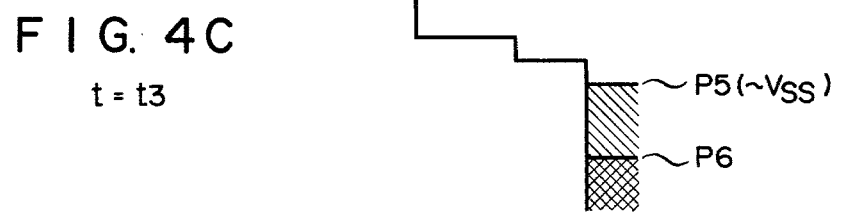
F I G. 4D
t = t4
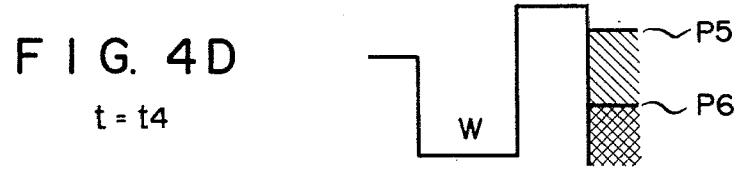

F I G. 5A
t = t1
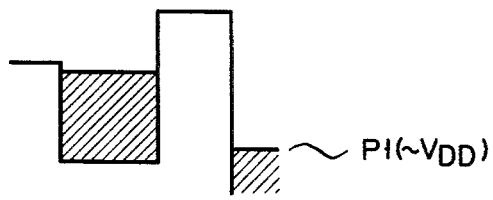
P1(~V_DD)
F I G. 5B
t = t2
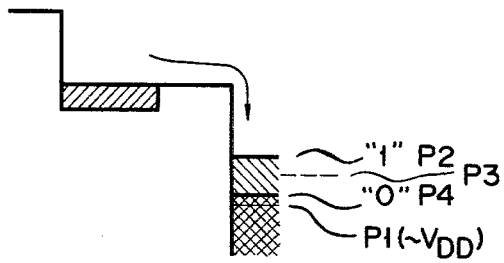
"1" P2
P3
"0" P4
P1(~V_DD)
F I G. 5C
t = t3
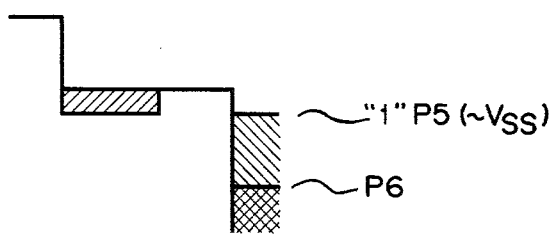
"1" P5 (~V_SS)
P6
F I G. 5D
t = t4
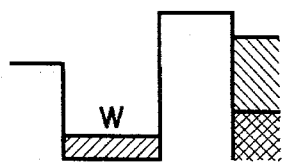
W t=t₁ t=t₂ t=t₃

F I G. 14
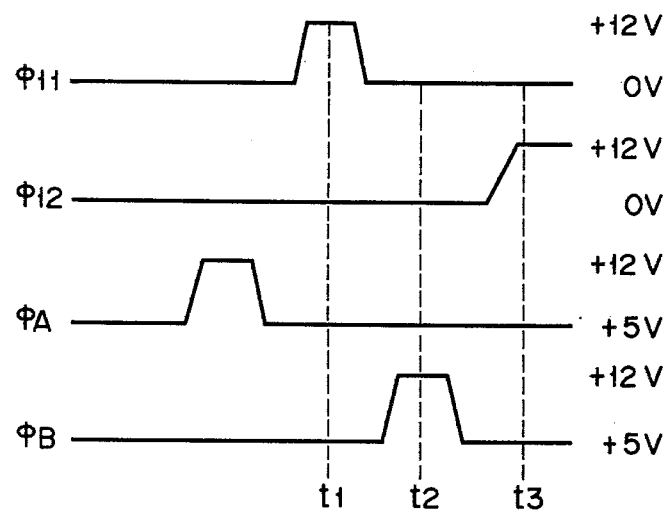
F I G. 15
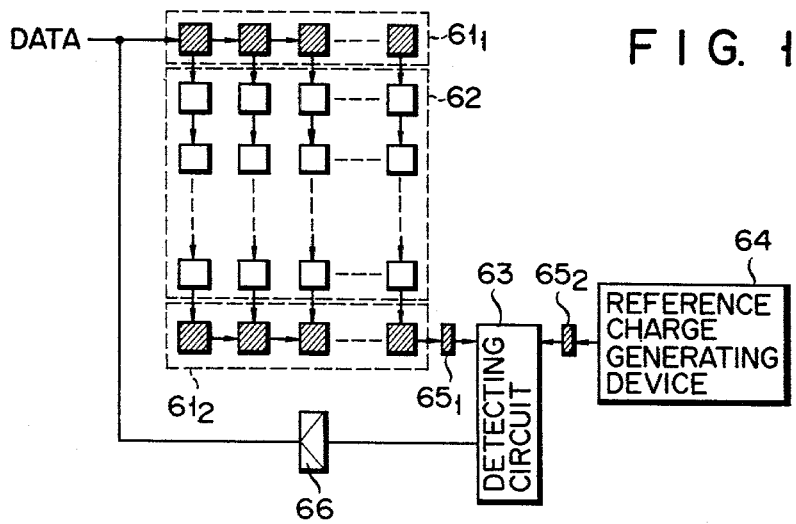

SEMICONDUCTOR CHARGE TRANSFER DEVICE HAVING A DECOUPLING GATE FOR STOPPING REVERSE CHARGE FLOW

This is a continuation of application Ser. No. 821,212 filed Aug. 2, 1977, now abandoned.

BACKGROUND OF THE INVENTION

The present invention relates to a semiconductor charge transfer device using a semiconductor charge transfer element such as CCD or BBD and, more particularly, improvements of the interface to transfer signal charge packets from the semiconductor charge transfer element to a sense amplifier.

In construction of a dynamic memory using CCD, for example, the signal charge packet must be detected when it remains at distinguishable level and then refreshed, in order to compensate for the reduction of the signal level resulting from the fact that, in the CCD mode, charge transfer is necessarily accompanied by leaving a little amount of charges in the packet well. To operate the CCD as a dynamic memory for dynamically storing signals (data), a closed loop must be formed in which the output signal from the CCD is detected and refreshed and fed back to the input stage of the CCD. In construction of such memories, a detecting device with good performances such as sensitivity, stability, response and the like is one of very important constitutional components.

By convention, signal charge packets are transferred to the detection node of the CCD, i.e. the floating diffusion region preset; the potential change at the detection node due to incoming signal charge packets is detected by a detecting circuit of inverter type or flip-flop type. The detecting system of the type in which the detection node is connected to the gate of the drive transistor of the inverter, is defective in the sensitivity and the response rate. A differential type detecting circuit is preferable in order to avoid erroneous operation of the system due to the variation of manufacturing or operational conditions of the components used.

One form of the differential type detecting circuits is a flip-flop type detecting circuit frequently used in the MOS type dynamic RAM or the like. Unlike the case of RAM needing the refreshing operation by the positive feedback to the detection node, in the CCD the back current of charge packets from the detection node must be prevented in order to avoid adverse interference. Therefore, it is said that it is difficult to directly use the detecting circuit system for the RAM for the CCD. One of the flip-flop type detecting circuits which has been proposed and practically used in order to avoid such the problem is of the type in which the detection node is coupled with the load transistor of the flip-flop. The exemplar thereof is shown in FIG. 1. As shown, the flip-flop is comprised of n-channel MOS transistors Q1 to Q4. The output of the CCD 2 is inputted to one load transistor Q3 and the reference signal from a reference charge generator 3 is inputted to the other load transistor Q4. See IEEE JOURNAL OF SOLID-STATE CIRCUITS, FEB., 1976, page 37.

This system, however, suffers some problems: the output signal, particularly at high level is susceptible to the signal charge level; the power consumption is large since it is of the called ratio type. The DC power consumption due to the ratio type is problematic in the low power operational mode at the idling of the CCD by low frequency drive.

In the FIG. 1 system, a clock signal $\Phi_1$ is made high in level when a clock $\Phi_2$ is at low level so that the n-channel MOS transistors Q5 and Q6 are turned on to precharge both the nodes A and B. Then, after the clock signal $\Phi_1$ is at low level, charges fed from the CCD 2 and the reference charge generating device 3 are fed to the nodes A and B, respectively, to provide a difference of potential between the A and B nodes. At this time, nodes C and D become low in level. As the clock signal $\Phi_2$ raises to the high level, the potentials at the nodes C and D raise to the high level. In this case, the difference potential between the nodes A and B brings about a difference between the potential increasing rates at the nodes C and D. Therefore, the potential at one of these nodes increases to reach the threshold level of each drive transistor Q1 and Q2, before the one at the other reaches it. In this case, the former forces the latter to be at the low level. As a result, one of the nodes C and D is stabilized at high level while the other node is stabilized at the low level, permitting the signal charge detection of the CCD 2.

In a normal operation, the potentials at the nodes C and D raise slightly at the initial stage. Therefore, when the potentials at these nodes are used as the input signal of the succeeding stage, it possibly brings about an erroneous operation. For this reason, the flip-flop 1 must be run considerably rapidly than the succeeding stage. Alternately, the response rate of the succeeding stage must be considerably slow. The high level at the output of the flip-flop 1 is $V_A - V_{TH}$ at the node C and $V_B - V_{TH}$ at the node D when $V_A > V_B$. In the relation, $V_A$ and $V_B$ are the potentials at the nodes A and B and $V_{TH}$ represents the gate threshold potential of each MOS transistor Q3 and Q4. $V_B$ is the output of the reference charge generating device 3 and thus constant. $V_A$ depends on the output of the CCD 2 so that the high level $V_A - V_{TH}$ at the node C changes depending on the amount of the signal charges fed from the CCD 2. Further, the operation rate of the flip-flop depends largely on the difference of potential between the nodes A and B.

The FIG. 1 system is basically of the ratio type. To operate the FIG. 1 system in the ratioless mode by additionally using transistors and clock signals, the charges at the nodes C and D are discharged to stabilize the potentials thereat and then the A and B nodes are made low level and the load tansistors Q3 and Q4 must be turned off. When the nodes A and B fall to $V_{SS}$ at the potential level for turning off the transistors Q3 and Q4, charges flow backward to the CCD 2. Accordingly, the feature of the FIG. 1 system which is devised to prevent the back current of charges, is meaningless.

SUMMARY OF THE INVENTION

Accordingly, an object of the present invention is to provide a semiconductor charge transfer device which may prevent charge packets from flowing backward to the CCD when the detection node of the CCD is at low level, with such a construction that the detection node of the CCD is directly connected to the drive transistor.

In brief, the semiconductor charge transfer device according to the present invention includes a semiconductor charge transfer element such as a CCD shift register and a differential detecting circuit of flip-flop type for detecting signal charges of which the drive transistor is connected at the input terminal to the detection node of the charge transfer element. A potential barrier for signal charge packets is provided at the preceeding stage of the detection node of the charge transfer element. The charge transfer element is driven in manner that the signal charge packet get over the potential barrier to reach the detection node.

Other objects and features of the present invention will be apparent from the following description taken in connection with the accompanying drawings, in which:

BRIEF DESCRIPTION OF THE DRAWING

FIG. 2 shows a schematic and circuit diagram of a semiconductor charge transfer device according to the present invention;

FIG. 3 is a set of timing diagrams useful in explaining the operation of the FIG. 2 device; FIGS. 4A to 4D illustrate potential distributions at the final stage of the CCD shown in FIG. 2;

FIGS. 5A to 5D illustrate the potential distribution corresponding to those in FIG. 4A to 4D when the final stage cell of the CCD of the FIG. 2 device is operated in the BBD mode;

FIG. 14 shows a set of timing diagrams for explaining the operation of the FIG. 12 device; and FIG. 15 is a block diagram of an embodiment of the invention when the present invention is applied to a CCD dynamic memory of serial-parallel-serial (SPS) type.

DETAILED DESCRIPTION OF THE PREFERRED EMBODIMENTS

Figure 1:
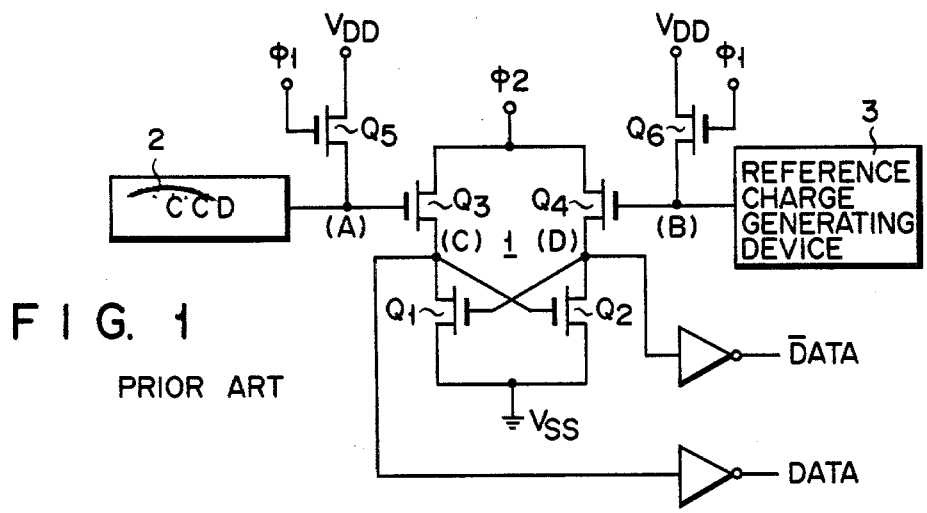
FIG. 1 shows a schematic and circuit diagram of an example of a conventional signal detecting circuit for the CCD.

Referring now to FIG. 2, there is shown a first embodiment of a semiconductor charge transfer device according to the present invention. A CCD 21 shown is of the type in which respective stages thereof includes a barrier formed by the ion injection in order to give a directionality to the charge transfer and each of the transfer electrodes $24_1$ and $24_2$ has a construction of partially double-layered polycrystal silicon. As seen from the partially illustrated cross sectional view of the CCD 21, the first and second gate electrodes $24_1$ and $24_2$ each made of polycrystal silicon are alternately and laterally arranged, being partially overlapped to each other, on an insulating layer such as a gate oxide layer 23 formed over a p-type (100) silicon substrate 22. A p+ layer 25 serving as the barrier is formed, by the ion injection, on the surface region of the substrate under the second gate electrode $24_2$. The first and second electrodes $24_1$ and $24_2$ which are adjacently disposed are connected and a clock signal $\Phi_A$ is applied to the connection point. The thickness of the gate oxide layer 23 under the first gate electrode $24_1$ is approximately 1,200 Å and that under the second gate electrode $24_2$ approximately 1,000 Å. At the final stage of CCD 21, an output gate electrode $24_3$ is formed above the substrate 22 with the oxide layer 23 formed therebetween, like the second gate electrode $24_2$ of the charge transfer portion. Additionally, a detection node 26 is formed on the surface region of the substrate 22, which the detection node is of the conductivity type different from that of the substrate 22. No ion injection layer is formed under the output gate electrode $24_3$; however, the potential barrier to the signal electrode is made by coupling the output gate electrode $24_3$ to a $V_{SS}$ of ground potential. A flip-flop generally designated by reference numeral 27 used for a differential type detecting circuit is comprised of n-channel MOS transistors. The circuit 27 is illustrated in terms of an equivalent circuit. In actuality, however, it is fabricated on the same substrate 22 on which the CCD 21 is formed. The flip-flop 27 comprises a couple of drive transistors Q11 and Q12 which operate complementally and another couple of load transistors Q13 and Q14. The load transistors Q13 and Q14 may be replaced by resistive elements. The detection node 26 is coupled with the node E of the flip-flop 27 while a reference charge generator 28 with another node F thereof. A transistor Q15 is connected between the nodes E and F of the flip-flop 27. A clock signal $\Phi_{11}$ is applied commonly to the gates of the transistors Q13, Q14 and Q15. The sources of the driver transistors Q11 and Q12 are coupled with the $V_{SS}$ via a transistor Q16 which is controlled by a clock signal $\Phi_{12}$. The output signals from the nodes E and F are outputted through buffers 29 and 30 in the forms of complementary signals D and $\overline{D}$.

The explanation to follow is the operation of the signal charge detection. The operational condition of the signal detection circuit for the CCD employed is as follows: $V_{DD} = +12$ V and $V_{SS} = 0$ V; a DC bias voltage $V_{BB} = -5$ V is applied to the substrate of the CCD 21; the low level (L) of the clock signals $\Phi_{11}$, $\Phi_{12}$ and $\Phi_A$ is $V_{SS}$ and the high level (H) thereof is $V_{DD}$. About 1.0 V was the threshold value of the output gate portion $24_3$ of the CCD 21 where no ion injection layer is provided, i.e. the potential barrier portion. FIG. 3 shows a timing chart of clock signals $\Phi_{11}$, $\Phi_{12}$ and $\Phi_A$. FIGS. 4A to 4D show the potential variations at the final stage of the charge transfer portion, the potential barrier under the output gate electrode $24_3$ and the detection node 26, with respect to time.

At time $t=t_1$, $\Phi_A = H$ and signal charges "1" are stored at the final stage of the CCD 21, as shown in FIG. 4a. The clock signal $\Phi_{11}$ is H and therefore the nodes E and F and the detection node 26 of the CCD 21 are preset at the preset potential P1, i.e. $V_{DD}$. At time $t=t_2$, $\Phi_{11} = L$. At this time, the preset potential of the detection node 26 is at the called floating potential, and the potential $\Phi_A = 0$ V. Accordingly, the signal charges stored at the final stage get over the potential barrier under the output gate electrode $24_3$ to reach the detection node 26, as shown in FIG. 4B. For this, the potential at the detection node changes in accordance with the signal "1" or "0". At this time, the node F is set at the intermediate potential P3 between the signal levels "1" and "0", due to the reference charges. P4 represents the potential after a fat "0" is transferred. Then, as the clock signal $\Phi_{12}$ changes from L to B, the flip-flop 27 is active. At time t=t3, the potential of the detection node E, i.e. the node E, is kept at about $V_{SS}$ for the signal level "1" and kept at approximately that level when t=t3 for the signal level "0". P6 represents the potential after the fat "0" charges are detected, as shown in FIG. 4C. In this manner, the potential at the node E changes in accordance with the signal level "1" or "0", in relation to the potential at the node F due to the reference charges. These output states of the flip-flop 27 are taken out in the forms of the data outputs D and $\overline{D}$, through the buffers 29 and 30. At time t=t4, the clock signal returns to H and the potential well W is formed in the final stage cell of the CCD 21, as shown in FIG. 4D. As seen from FIG. 4D, even if the potential node 26 is $V_{SS}$, the preceding potential barrier may prevent the back current of the charges from the detection node 26 when the signal appearing under the gate electrode 24₃ is at low level, since the gate electrode 24₃ is connected to the $V_{SS}$.

In the above-mentioned embodiment, the potential barrier to prevent the back current of charges to the CCD is formed by connecting the $V_{SS}$ to the output gate electrode 24₃ which is concurrently formed in the same process as of the second electrode 24₂ of the charge transfer portion. However, the potential of the output gate electrode 24₃ is not necessarily set at the $V_{SS}$. The necessity to attain this end is that the substrate surface under the output electrode 24₃ has the surface potential enough to prevent the charge back current and further is placed in a depletion state permitting the charge to be transferred to the detection node. If such the condition is satisfied, the output gate electrode 24₃ may be formed through the same process as of the first gate electrode 24₁. In this case, the oxide layer under the output gate electrode 24₃ is thinner than that of the above-mentioned embodiment. In addition to the polycrystal silicon, aluminum, molybdenum or the like may be used for the material of the electrodes. The combination of such the metal with the polycrystal silicon may be employed in place of the just-mentioned one.

It will be understood that the present invention is applicable not only for a complete charge transfer mode, i.e. the called CCD mode, but also for an incomplete charge transfer mode, i.e. the called BBD mode. The operation at the final stage of the charge transfer portion in the BBD mode is illustrated in FIGS. 5A to 5D, using the timing chart of FIG. 3 which was used in the previous embodiment. The BBD mode operation is much the same as the CCD mode operation except that a little amount of charges remains in the well after charges are transferred, as shown in FIGS. 5A to 5D.

Generally, the efficiency of charge transfer of the BBD mode is inferior to that of the CCD. In the example of FIG. 4, application of the BBD mode to the last stage cell minimizes the deterioration of the transfer efficiency of charges. For example, in a CCD shift register operating in the ordinary CCD mode, only the potential barrier portion coupled with the detection node is kept at such a potential level as to provide a barrier relative to the $V_{SS}$. In this way, only the last stage of the shift register is operated in the BBD mode. Change of the clock signal level is not essential for this case and only physical correction of the final stage cell is needed by taking account of the fact that the charge storing capacity of the last stage cell is reduced by the amount of charges left due to the BBD mode.

Figure 6:
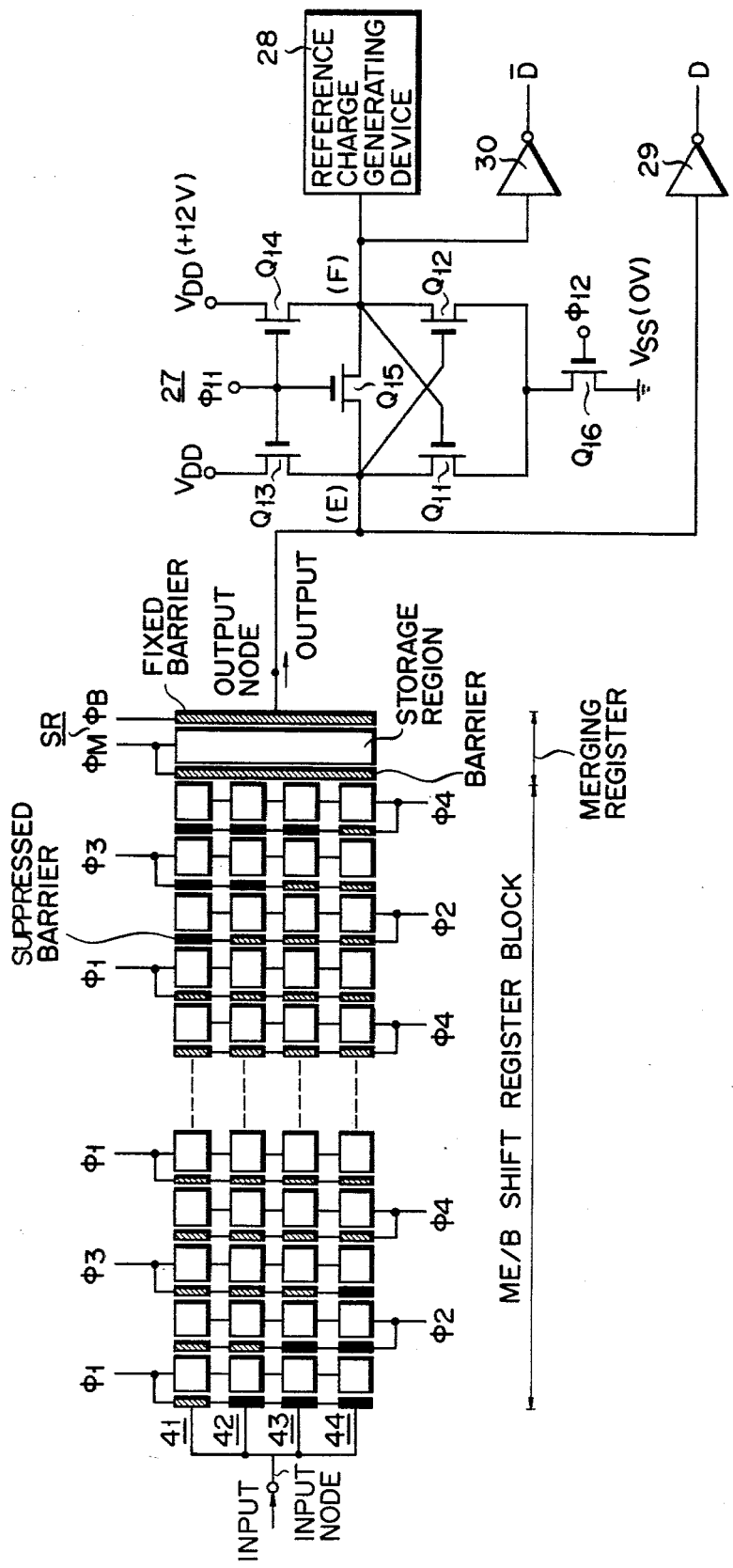
FIG. 6 shows another embodiment of the semiconductor charge transfer device according to the present invention.

FIG. 6 shows another embodiment of the signal detection circuit according to the present invention featured by a shift register block using a multiplex electrode per bit (ME/B) structure type charge transfer device. In this example, the flip-flop block is the same as of the FIG. 2 embodiment.

Figure 7:
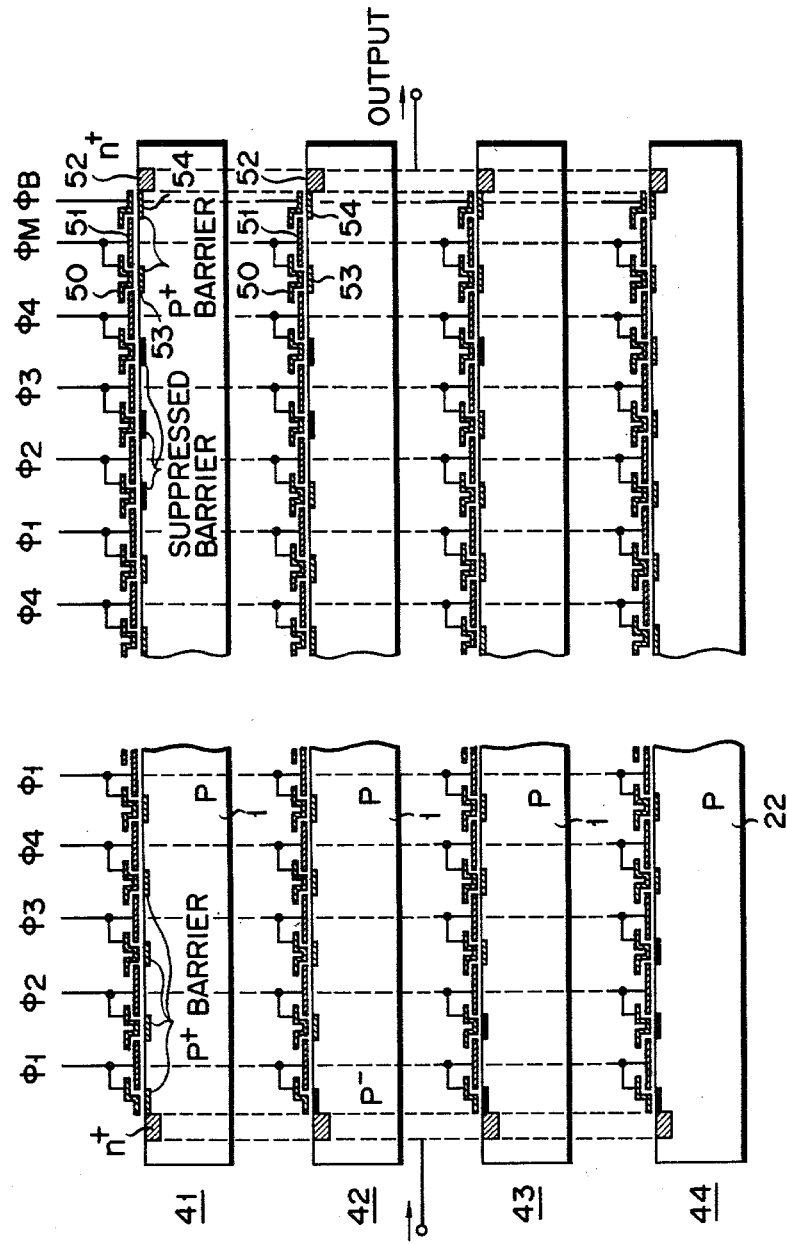
FIG. 7 shows a cross sectional view of one channel of the FIG. 6 CCD.

Referring now to FIG. 6, there is shown an example of the transfer device in which suppressed barriers are formed under the second electrodes of the coupling cells and the bias electrode, in order to ensure the signal charge margin. In the figure, shadowed portions indicate the p⁺ barriers of the storage cells and blacked portions the p⁻ suppressed barriers of the coupling cells. The suppressed barrier may be formed by implanting phosphor ions, at the concentration of, for example, $2 \times 10^{11}$ cm⁻², in the p-type substrate. The cross section of each charge transfer channel of FIG. 6 is illustrated in FIG. 7. The ME/B structure is provided at the input and output with n+ type input and output nodes formed in the substrate 1 in the direction normal to the charge transfer direction.

The ME/B shift register blocks shown in FIG. 6 have the bit length of (N−1)×M bits and a merging shift register having an arbitrary bit length coupled with the ME/B shift register block, the bit length of the register block may be flexibly set. The merging shift register is driven by the clock pulse with the frequency N times the N-phase clock pulses' frequency applied to the ME/B block. Suppose now that the merging shift register has the bit length of S. The total bit length is (N−1)×M+S.

Figure 8:
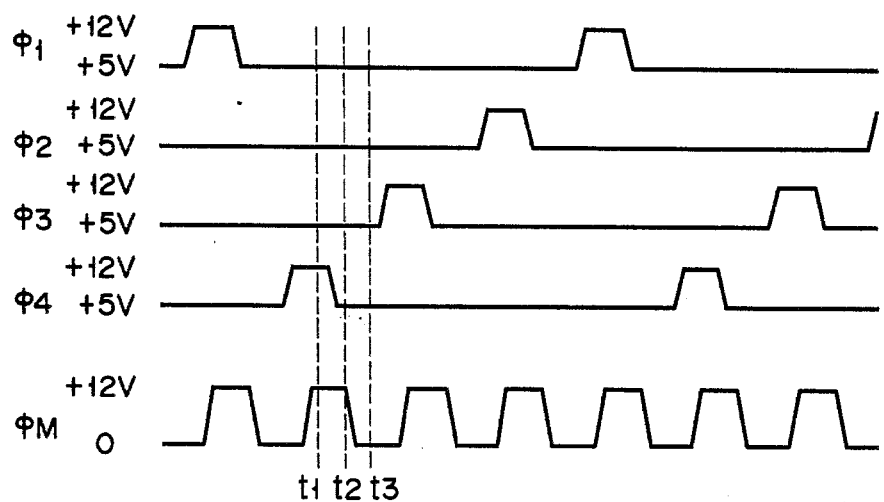
FIG. 8 shows a set of timing diagrams for explaining the operation of the FIG. 6 embodiment.

Referring to FIG. 6, there is shown an example of the ME/B shift register block followed by a merging shift register SR with one bit. As shown in FIG. 6, at the output side is provided one bit storage cell including barrier and storage regions, and a fixed barrier region, those regions being common to all the channels. P+ region 53 for forming p⁺ barrier is formed under the electrodes 50. P+ region 54 for forming the fixed barrier is formed under electrodes 52 to which the bias potential $\Phi_M$ having the frequency four times the clocks $\Phi_1$ to $\Phi_4$ is applied to the electrodes 50 and 51 of the merging shift register SR. A relationship between the clocks $\Phi_1$ to $\Phi_4$ and the clock $\Phi_M$ is shown in FIG. 8. The clock $\Phi_M$ is biased to a low level of 0 V and pulsed to a high level of +12 V.

Figure 9:
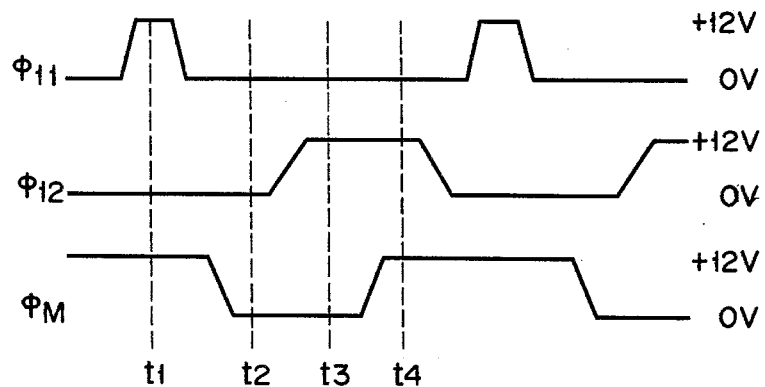
FIG. 9 shows a set of timing diagrams of clock signals for explaining the operation of the signal charge detecting portion of the FIG. 6 embodiment.

The operation of the FIG. 6 example will be described with reference to FIGS. 8 and 9. At the time $t_1$ when only the clocks $\Phi_4$ and $\Phi_M$ are pulsed to the high level, the potential wells under the clocks $\Phi_4$ and $\Phi_M$ electrodes become deep. Accordingly, the signal charge packets stored in the preceding storage cells under the $\Phi_3$ electrode, flows into the potential wells under the $\Phi_4$ electrodes of the ME/B shift register block. With the final stages, only the final stage $\Phi_4$ driven storage cell of the fourth channel 44 receives the signal charge packet from the $\Phi_3$ driven storage cell. At the time $t_1$, although the potential well of the shift register is deep the merging shift register SR receives no signal charge packet since the potential well under the $\Phi_4$ electrode is also deep.

At the time $t_2$, the clock $\Phi_4$ returns to the storage level while the clock $\Phi_M$ is kept at the transfer level. Accordingly, the final stage potential well of the fourth channel rises in the potential level so that the signal charge packet is transferred into the deep potential well of the shift register SR. At this time, the signal charge packet transferred to the merging shift register fails to pass the fixed barrier formed by the bias potential $\Phi_{BIAS}$ and thus fails to reach the sense node.

At the time $t_3$ when the clock $\Phi_M$ is at the low level, the potential of the storage cell of the merging shift register rises above the fixed barrier so that the signal charge stored in the storage cell flows into the detection node.

While a single shift register SR common to the respective channels is used in the FIG. 6 embodiment, separate merging shift registers may be connected to the channels, respectively.

A fixed barrier formed between the last stage of the CCD and the detection node is used in both the cases of FIGS. 2 and 6. However, the barrier is not limited to such a fixed type one. Any type of barrier is usable if it can prevent the back flow of charges at least when the flip-flop stage is at low level.

Figure 10:
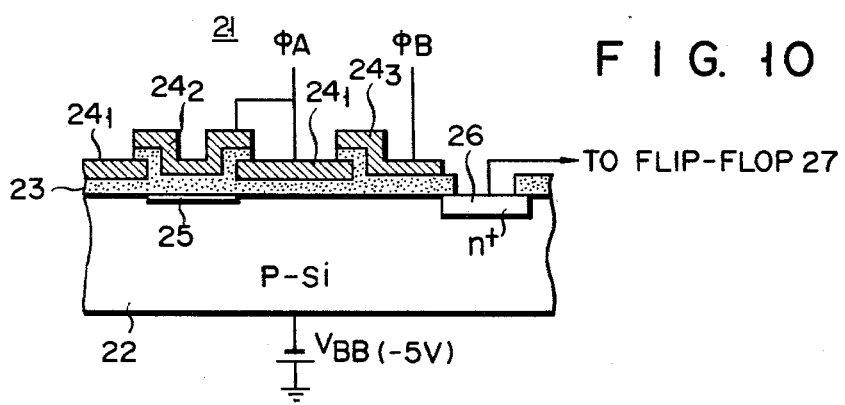
FIG. 10 shows a schematic diagram of the major part of another embodiment of the present invention.
Figure 11:
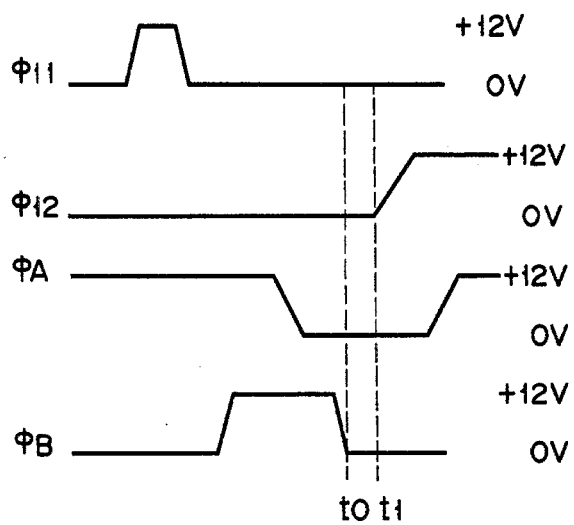
FIG. 11 shows a set of timing diagrams for explaining the operation of the FIG. 10 embodiment.

A clocked barrier formed by applying a clock signal $\Phi_B$ to the decoupling gate $24_3$ is used in a further embodiment shown in FIG. 10. The clock signal $\Phi_B$ applied to the decoupling gate $24_3$ is levelled down from 12 V to 0 V at the time $t_0$ preceding to the time $t_1$ where the clock signal $\Phi_{12}$ levels up from 0 V to +12 V, i.e. the node E of the flip-flop 27 falls the LOW ($V_{SS}$) level.

Figure 12:
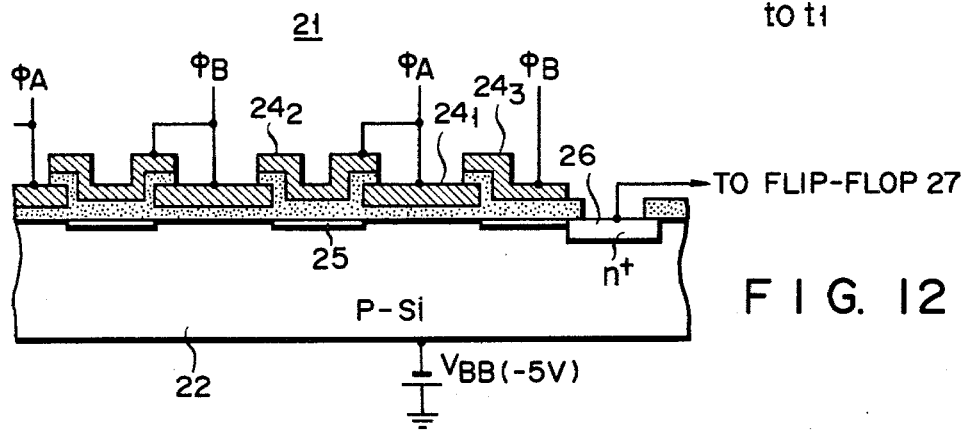
FIG. 12 shows a schematic diagram of the major part of still another embodiment of the present invention.
Figure 13A:
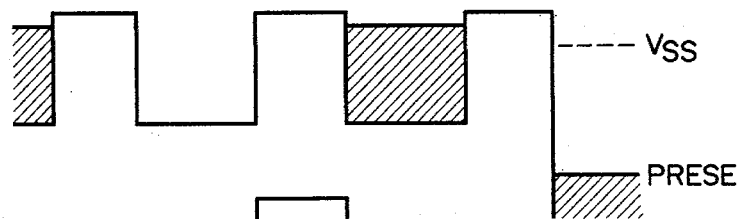
FIGS. 13A to 13C illustrate the potential distributions at the final stage of the CCD in the FIG. 12 example.
Figure 13B:
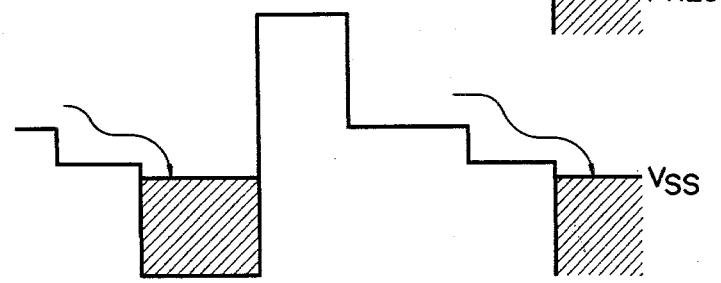
Figure 13C:
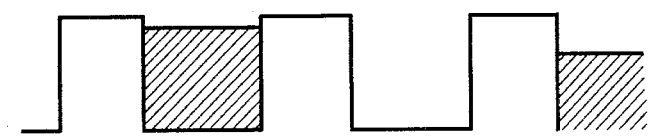

FIG. 12 shows an embodiment in which the barrier is controlled by a transfer clock signal. In this example, the clock signal $\Phi_A$ timed as shown in FIG. 14 is applied to electrodes $24_1$ and $24_2$ and the block signal $\Phi_B$ is applied to the gate electrode $24_3$. In the transfer operation of the CCD 21, the charge packet stored in the final stage cell as indicated by slanted lines at $t=t_1$ in FIG. 13A is discharged to the node E of the flip-flop 27 at $t=t_2$ in FIG. 13B, when the clock signal $\Phi_B$ is at high level (+12 V). Then, the clock signal $\Phi_B$ shifts to low level (+5 V) and the clock signal $\Phi_{12}$ shifts to +12 V, as shown in FIG. 14. Therefore, at $t=t_3$ in FIG. 13C, barrier by the clock signal $\Phi_B$ is formed under the electrode $24_3$ when the transfer clock signal $\Phi_A$ is at low level, thereby preventing effectively the back flow of charges. Although the clock signals in FIG. 14 within the offset levels (+5 V to +12 V) are used, other levels range of clock signals of, for example, 0 to +12 V may be used through the control of the surface potential.

Known as another CCD memory is the called serial-parallel-serial (SPS) memory, set forth in IEE JOURNAL OF SOLID-STATE CIRCUITS FEB. 1976, on page 34, FIG. 1. In the SPS memory comprising combination of serial register and parallel register, number of charge transfer in the serial portion is smaller than that of the whole transfer memory. Therefore, if the serial register portion is operated in the BBD mode, the entire of the SPS memory operates with satisfactory characteristic. Accordingly, the SPS memory may be constructed such that only the output serial register or the input and output serial registers except the parallel register portion operates in the BBD mode. When such the SPS memory is used in combination with the detection means mentioned above, it is possible to simplify the operational conditions of the clock levels or the like.

FIG. 15 shows a schematic construction of an embodiment of the present invention in which the SPS memory with serial registers driven in the BBD mode is used. In the figure, reference numeral $61_1$ designates an input serial register operating in the BBD mode, and $61_2$ an output serial register operating in the BBD mode. A parallel register 62 is inserted between these serial registers $61_1$ and $61_2$.

A detection circuit 63, like the FIG. 2 embodiment, comprises a flip-flop circuit. The input terminals thereof are the gates of the drive transistors. The signal charges fed from the output serial register $61_2$ is inputted to the detection circuit 63 through the potential barrier $65_1$. The reference charges generated by the reference charge generating device 64 are also inputted to the detection circuit 63 through the potential barrier $65_2$. The output of the detection circuit 63 is fed back to the input stage of the SPS memory through an amplifier 66 where the signal level is reproduced. In this way, the system including these components acts as a dynamic memory.

In the embodiments heretofore described, the reference charges are used for the reference signal in the differential type detection circuit. However, the reference signal may be given in terms of potential. The differential type detecting circuit may be constructed not only by the flip-flop but also by other suitable means such as a ratio type means. The clock system for the charge transfer element may be of single, two-, three- or any other phase type.

As described above, in the charge transfer device according to the present invention, the potential barrier is provided at the preceding stage of the detection node. Therefore, the flip-flop type detecting circuit system in the dynamic MOS/RAM which has been considered difficult in application thereof to the detection circuit, may be used for the detection circuit without any modification. As a result, the detecting operation is stably performed at high speed and with low power consumption. The present invention is useful particularly for the dynamic memory using the CCD shift register.

What is claimed is:

1. A semiconductor charge transfer device comprising:
    a semiconductor charge transfer element including a plurality of transfer electrodes on an insulating layer formed on a semiconductor substrate and a detection node formed on the semiconductor substrate;
    potential barrier means comprising an output electrode connected via a direct short circuit connection to a potential source of fixed value for signal charge packets provided between a final stage cell of the semiconductor charge transfer element and the detection node;
    a differential detecting circuit of flip-flop type having a drive transistor for driving a load directly coupled with the detection node;
    wherein said potential barrier means provided a potential barrier against a low level of the detection node when the drive transistor is conductive and said potential source of fixed value is connected to the low level side of said drive transistor;
    said semiconductor charge transfer element, having a multiplex electrode per bit (ME/B) structure, comprising:
    N charge transfer channels arranged in parallel whose inputs are connected to a common input means and outputs to a common output means, which includes a merging shift register of one bit storage cell including a barrier, a storage region, and a fixed barrier region, these regions being common to all said N charge transfer channels;
    said charge transfer channels each including a semiconductor substrate, an insulating layer formed on said semiconductor substrate, P transfer electrodes per one channel disposed on said insulating layer, the N corresponding transfer electrodes of said N charge transfer channels being electrically connected together, and means for forming a potential barrier in part at a prescribed portion of a semiconductor region under each of a series of said P transfer electrodes of each of said charge transfer channels such that a number M of said P charge transfer electrodes, where M is less than P, remain dedicated as charge transfer electrodes, in response to application of a potential for a storage mode to the transfer electrode thereby to form a potential well in the remaining part of said semiconductor region for storing a signal charge packet, and said potential barrier being lowered in potential compared to the potential barrier being in the storage mode in response to application of a potential for the transfer mode to the transfer electrode;

means for applying N-phase non-overlapping offset clock pulse signals to said transfer electrodes of said N charge transfer channels, said clock pulse signals each being biased to low level for storage and pulsed to high level for transfer in order that a series of N transfer electrodes in each of said charge transfer channel are successively set to the transfer mode in the direction opposite to a charge transfer direction; and means for forming a fat "0" potential barrier in part at the charge incoming side of a semiconductor region under each of transfer electrodes disposed between the input of said each charge transfer channel and the set of M transfer electrodes, when said transfer electrodes are at the storage mode, to store a fat "0" charge in the remaining part of said semiconductor region.

2. A semiconductor charge transfer device comprising:

a semiconductor charge transfer element including a plurality of transfer electrodes on an insulating layer formed on a semiconductor substrate and a detection node formed on the semiconductor substrate;

potential barrier means comprising an output electrode connected via a direct short circuit connection to a potential source of fixed value for signal charge packets provided between a final stage cell of the semiconductor charge transfer element and the detection node;

a differential detecting circuit of flip-flop type having a drive transistor for driving a load directly coupled with the detection node;

wherein said potential barrier means provides a potential barrier against a low level of the detection node when the drive transistor is conductive and said potential source of fixed value is connected to the low level side of said drive transistor;

said semiconductor charge transfer element, having a multiplex electrode per bit (ME/B) structure, comprising:

N charge transfer channels arranged in parallel whose inputs are connected to a common input means and outputs to a common output means, which includes a merging shift register of one bit storage cell including a barrier, a storage region, and a fixed barrier region, these regions being common to all said N charge transfer channels;

said charge transfer channels each including a semiconductor substrate, an insulating layer formed on said semiconductor substrate, P transfer electrodes per one channel disposed on said insulating layer, the N corresponding transfer electrodes of said N charge transfer channels being electrically connected together, and means for forming a potential barrier in part at a prescribed portion of a semiconductor region under each of a series of said P transfer electrodes of each of said charge transfer channels such that a number M of said P charge transfer electrodes, where M is less than P, remain dedicated as charge transfer electrodes, in response to application of a potential for a storage mode to the transfer electrode thereby to form a potential well in the remaining part of said semiconductor region for storing a signal charge packet, and said potential barrier being lowered in potential compared to the potential barrier being in the storage mode in response to application of a potential for the transfer mode to the transfer electrode;

means for applying N-phase non-overlapping offset clock pulse signals to said transfer electrodes of said N charge transfer channels, said clock pulse signals each being biased to low level for storage and pulsed to high level for transfer in order that a series of N transfer electrodes in each of said charge transfer channel are successively set to the transfer mode in the direction opposite to a charge transfer direction; and means to make lower the surface potential on part at the charge incoming side of a semiconductor region under each of transfer electrodes disposed between the output of said each charge transfer channel and the set of M transfer electrodes, as compared with that on the remaining part of said semiconductor region.

* * * * *